United States Patent [19]

Nelson et al.

[11] 4,276,098

[45] Jun. 30, 1981

[54] BATCH PROCESSING OF SEMICONDUCTOR DEVICES

[75] Inventors: Ronald J. Nelson, Berkeley Heights; Phillip D. Wright, New Providence, both of N.J.

[73] Assignee: Bell Telephone Laboratories, Incorporated, Murray Hill, N.J.

[21] Appl. No.: 135,643

[22] Filed: Mar. 31, 1980

[51] Int. Cl.³ .................................... H01L 21/208
[52] U.S. Cl. ............................ 148/171; 29/569 L; 29/574; 29/583
[58] Field of Search ............... 148/171, 172; 156/649; 29/574, 569 L, 583

[56] References Cited

U.S. PATENT DOCUMENTS

| | | | |
|---|---|---|---|
| 3,457,633 | 7/1969 | Marinace et al. | 29/583 |
| 3,689,993 | 9/1972 | Tolar | 29/583 |
| 3,808,058 | 4/1974 | Henning | 148/1.5 |
| 3,897,627 | 8/1975 | Klatskin | 29/583 X |
| 3,955,082 | 5/1976 | Dyment | 148/171 X |
| 3,972,113 | 8/1976 | Nakata et al. | 29/583 X |
| 4,029,531 | 6/1977 | Marinelli | 156/647 |
| 4,033,796 | 7/1977 | Burnham et al. | 148/175 |
| 4,136,928 | 1/1979 | Logan et al. | 331/94.5 H |
| 4,186,407 | 1/1980 | Delagebeaudeuf et al. | 148/171 X |
| 4,190,813 | 2/1980 | Logan et al. | 148/171 X |

OTHER PUBLICATIONS

Hurwitz et al., *Applied Physics Letters,* vol. 27, No. 4, Aug. 15, 1975, pp. 241–243.
Dobkin et al., *Soviet Physics–Semiconductors,* vol. 4, 1970, pp. 515 and 516.

*Primary Examiner*—G. Ozaki
*Attorney, Agent, or Firm*—Michael J. Urbano

[57] ABSTRACT

Discrete InP-InGaAsP mesa double heterostructure lasers have been fabricated by a batch process in which the laser mirrors are formed by chemically etching the wafer from the top surface down into the substrate. A feature of the process is that the metal contact on the top surface is recessed within the periphery of an overlying mask, and the etching time is controlled so that the contact is not undercut by the sidewalls of the mesa. Another feature is the use of a self-limiting etchant which etches the mirrors smoothly and at a faster rate than the sidewalls. Preferably, the mirrors etch isotropically and the sidewalls etch preferentially along crystallographic planes. Also described is subsequent batch processing (e.g., forming mirror coatings) and on-wafer testing of the etched-mirror lasers.

13 Claims, 3 Drawing Figures

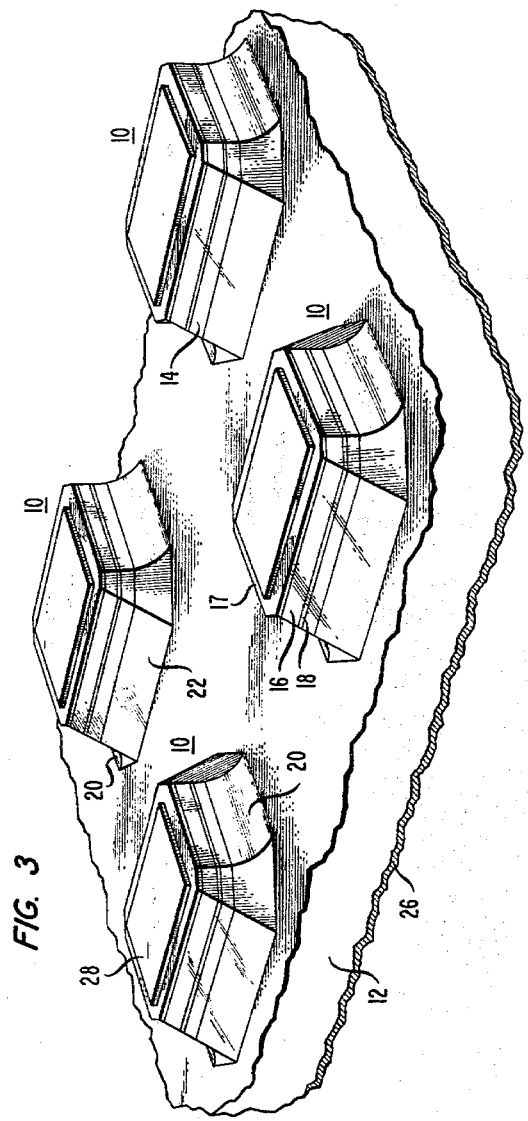
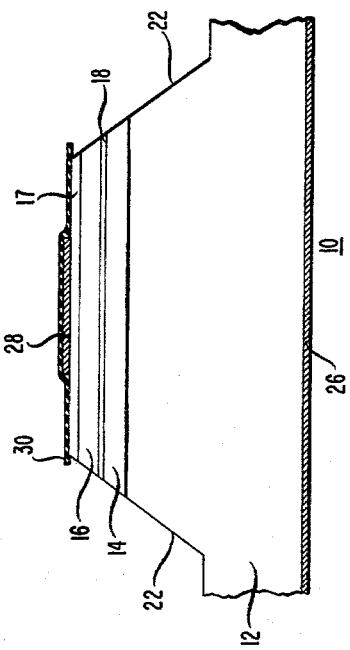
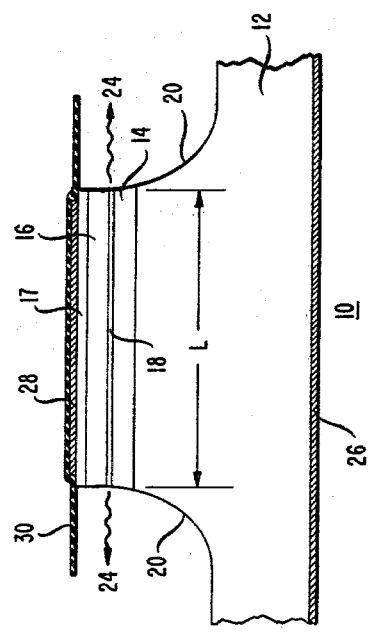

BATCH PROCESSING OF SEMICONDUCTOR DEVICES

BACKGROUND OF THE INVENTION

This invention relates to semiconductor devices and, more particularly, to batch processing semiconductor lasers.

In most previous work, the procedures used to fabricate discrete heterostructure lasers from Group III-V compounds and alloys have included mirror formation by breaking the crystal along (110) cleavage planes. Many of the lasers thus fabricated have excellent properties, but there are many disadvantages inherent in the fabrication of laser mirrors by cleaving. Foremost among these disadvantages is the loss of the ability to batch process the devices after die separation (i.e., cleaving). Rather, each die has to be individually handled for subsequent processing (e.g., applying facet coatings) and for testing. Cleaving also places restrictions on laser geometry, including minimum laser length. Although shorter lasers have a number of distinct advantages, including lower threshold current (lower power consumption) and wider longitudinal mode spacing (single mode operation), the fabrication of such lasers by conventional cleaving techniques is difficult to perform reproducibly and has a low associated yield. In contrast, a discrete laser batch fabrication process, without the geometrical restrictions implicit in the cleaved mirror approach, should open the way to the realization of a number of advanced electro-optical components. By way of example, such components might include a semiconductor laser fabricated on the same chip with a photodiode for feedback control or with a transistor for drive control.

In the past, however, potential integrated optics applications rather than batch fabrication processing has prompted workers to seek alternatives to cleaving the laser mirrors. The dominant alternative seems to be chemical etching. A decade ago, A. S. Dobkin et al [*Sov. Phy. Semicond.*, Vol. 4, page 515 (1970)] demonstrated that etched mirrors could be fabricated on (100)-oriented GaAs homojunction lasers by etching with a peroxide-alkali solution ($H_2O_2$ and NaOH), and predicted that such lasers had application in the field of integrated optics. Later, C. E. Hurwitz et al [*Appl. Phys. Lett.*, Vol. 27, No. 4, page 241 (1975)] brought that prediction closer to reality by using an acidic-peroxide solution ($1H_2SO_4:8H_2O_2:1H_2O$) to etch mesas into (100)-oriented GaAs-AlGaAs double-heterostructure (DH) wafers. Opposite, parallel mesa walls were formed perpendicular to the (100) surface and defined the Fabry-Perot cavity resonator. Radiation at 9100 Angstroms was coupled through the mirrors into thick GaAs waveguide layers grown adjacent to the mesa. A significant advance was then made by R. A. Logan et al [U.S. Pat. No. 4,136,928 (1979)] who recognized the utility of making the AlGaAs DH laser mirrors oblique to the resonator axis (rather than perpendicular to it) in order to couple the laser radiation into an underlying waveguide. The mirrors were (1$\bar{1}$1) crystal facets and were formed by orienting the lasers along the <110> direction and exposing the active layer to a superoxyl etchant ($H_2O_2$ and $H_2O$, pH ~7).

Although Dobkin et al do not specify how their lasers were masked for the etching step, Hurwitz et al used a photolithographically defined pyrolytic $SiO_2$ mask to define rectangular mesas. As depicted in FIG. 1, a sputtered Cr-Au contact was made coextensive with the top of the mesa. In contrast, Logan et al (column 5, lines 1 et seq.) used standard photolithography to form rectangular resist patterns on a previously evaporated Au contact layer. Subsequent etching undercut the contact layers 24 and 26 as shown in the drawing.

SUMMARY OF THE INVENTION

We have found that when fabricating etched-mirror semiconductor mesa lasers of Group III-V compounds, it is important that the electrical contact to the mesa not be exposed to the etchant. Otherwise, the etchant tends to undercut the contact and/or causes the edges of the contact to deteriorate. This problem, therefore, precludes several simple expedients: using the metal contact itself as an etch mask, or using the combination of a dielectric layer (e.g., photoresist) coextensive with the metal contact as a mask.

In accordance with one aspect of our invention, batch processing of semiconductor lasers is realized by an etched-mirror fabrication technique having as one feature that the mesa contact is protected from the etchant by recessing the contact within the periphery of an overlying mask and that the etching time is controlled so that the mesa walls (sidewalls and mirrors) do not undercut the contact. Another feature resides in the choice of etchant and crystal orientation so that the mirrors etch smoothly and at a much faster rate than the sidewalls, thereby enabling independent control of the laser length. Preferably, the mirrors etch isotropically, and the sidewalls etch preferentially along crystallographic planes.

We used this technique to batch process discrete InP-InGaAsP DH lasers which emitted at 1.3 $\mu$m and had relatively low current density thresholds.

BRIEF DESCRIPTION OF THE DRAWINGS

Our invention, together with its various features and advantages, can be readily understood from the following more detailed description taken in conjunction with the accompanying drawings in which the figures are not drawn to scale in the interests of clarity:

FIG. 1 is a cross-section, viewed perpendicular to the resonator axis, of an etched-mirror DH mesa laser fabricated in accordance with our invention;

FIG. 2 is a cross-section, viewed parallel to the resonator axis, of an etched-mirror DH mesa laser fabricated in accordance with our invention; and FIG. 3 is an isometric view of a wafer on which etched-mirror DH mesa lasers have been fabricated in accordance with our illustrative embodiment of our invention.

DETAILED DESCRIPTION

With reference now to the drawing, a semiconductor junction laser 10 includes a single crystal substrate 12 and a plurality of epitaxial layers grown thereon to define at least an active region 18 capable of emitting stimulated radiation 24 when suitable voltage and current are applied. Illustratively, laser 10 has a DH configuration including a pair of opposite-conductivity-type cladding layers 14 and 16 and the active region 18 which is sandwiched between, and essentially lattice-matched to, layers 14 and 16.

Using masking layer 30 and fabrication procedures to be described later, a wafer, including substrate 12 and the various layers, is etched to form each laser as a mesa. Opposing surfaces 20 (FIG. 1) are etched isotropically through the layers and into the substrate so that they are essentially perpendicular to active region 18, thereby forming a cavity resonator. In contrast, surfaces 22 (FIG. 2) are etched preferentially so that they form crystal planes at an angle to the layers, thereby forming the sidewalls of the laser.

Metal contacts 26 and 28 are formed on the bottom of substrate 12 and on the top of the mesa, respectively. Masking layer 30, which is shown covering contact 28 in FIGS. 1 and 2, is used during processing only and prior to operation or electrical/optical testing of the lasers is removed as shown in FIG. 3. During such operation or testing, a forward bias voltage and pumping current in excess of threshold are applied to contacts 26 and 28 to generate emission 24 at a wavelength $\lambda$ which is characteristic of the semiconductor material of active region 18. Thus, if the active region 18 comprises $Al_xGa_{1-x}As$ ($0 \leq X \leq 0.4$), then $\lambda$ ranges from about 0.9 $\mu$m to 0.7 $\mu$m. In contrast, if region 18 comprises $In_{x-}Ga_{1-x}As_yP_{1-y}$ ($1.0 > X > 0.53$; $0 < y < 1$), then $\lambda$ ranges from 0.92 $\mu$m to 1.65 $\mu$m. Generally, x and y are chosen so that this quaternary is essentially lattice matched to InP cladding layers and/or to other quaternary layers.

In practice, it should be noted that, depending on system considerations, laser 10 can take on a variety of configurations including, by way of example, and without limitation, a homostructure, a mesa DH as shown in FIGS. 1–3, a stripe geometry laser (e.g., FIG. 2 with contact 28 narrower), a strip-buried heterostructure as described by R. A. Logan et al in U.S. Pat. No. 4,190,813, a separate confinement heterostructure, or an isotype heterostructure as described by R. L. Hartman et al in copending application Ser. No. 050,637, filed on June 21, 1979, and assigned to the assignee hereof.

For efficient operation, and especially for continuous wave operation at room temperature, the laser 10 is typically coupled to a suitable heat sink to draw heat from the active region, and the active region is made relatively thin to enhance carrier confinement and electronic gain. Illustratively, a heat sink (not shown) is bonded or otherwise thermally and mechanically coupled to contact 28 (because it is closer to active region 18 than contact 26), and active region 18 is about 0.15 to 0.5 $\mu$m thick.

As mentioned previously, etched-mirror lasers 10 have significant advantages over cleaved-mirror lasers. From a device design standpoint, the laser length L (FIG. 1) is determined by the etching time and the mask configuration, rather than by the constraints associated with the cleaved mirror approach. Thus, extremely short lasers with concomitant lower threshold currents and wider longitudinal mode spacing can be realized. In contrast, from a fabrication standpoint, the etched-mirror lasers enable, for example, a dielectric layer to be deposited over the wafer to simultaneously form mirror coatings on all of the lasers. On the other hand, from a testing standpoint, device characteristics (e.g., current-voltage curves, ideality factor) can be measured while the lasers are still an integral part of the wafer; i.e., before separating the lasers into individual devices, as shown in FIG. 3. In this regard, the emission from one laser can be sensed by an adjacent laser used as a "detector." The radiation from the laser active region may be coupled directly into the "detector" active region (since on the wafer they are essentially perfectly aligned) or indirectly by transmission through the substrate (assuming it is transparent) and reflection from the contact 26. In the latter case, the radiation would be predominantly spontaneous emission.

In order to realize the foregoing etched-mirror laser with its attendant advantages, we employ the following fabrication procedure in accordance with our invention. After the Group III–V compound semiconductor wafer has been fabricated (e.g., after epitaxial layers 14, 16, and 18 have been grown on substrate 12), standard photolithographic lift-off techniques are used to define rectangular metal contacts 28 on the top surface of the wafer. Next, an etch-resistant masking layer is deposited on the top surface and photolithography is again employed to open windows in the masking layer, thereby exposing the underlying semiconductor surface, and to leave rectangular masks 30 (FIGS. 1 and 2) on top of the contacts 28. A suitable etchant is then applied to attack the exposed semiconductor and to form the desired mesa shape of the lasers; i.e., the etched-mirror surfaces 20 and the etched sidewalls 22. The masks 30 are then removed (FIG. 3).

It is a feature of our invention that the metal contacts 28 are protected from attack by the etchant, first, by recessing the contact 28 within the periphery of the mask 30 and, second, by controlling the etching time so that the surfaces 20 and 22 do not undercut contact 28.

Another feature resides in the choice of etchant and crystal orientation so that the etched-mirror surfaces 20 etch at a much faster rate than the sidewalls 22. In particular, it is preferred that the mirror surfaces 20 etch isotropically and that the sidewall surfaces 22 etch preferentially along crystallographic planes. Illustratively, the etchant is a solution of Br in methanol, the epitaxial layers are (100) planes, the resonator axis is along the $<011>$ direction and the sidewalls 22 are (111) planes.

EXAMPLE

The following example describes the fabrication of InP-InGaAsP DH lasers by the foregoing technique. Specific processing and/or device parameters are given for the purpose of illustration only and, unless otherwise stated, are not intended to limit the scope of the invention.

Fabrication of discrete InGaAsP etched-mirror lasers begin with the growth of a double heterostructure wafer by liquid phase epitaxy (LPE). The four-layer heterostructure was grown on a (100) n-type InP substrate 12 using a near-equilibrium LPE technique. An n-type InP cladding layer 14 about 3 $\mu$m thick was grown followed by an n-type $In_xGa_{1-x}As_yP_{1-y}$ ($x \approx 0.72$, $y \approx 0.62$) active layer 18 about 0.3–0.4 $\mu$m thick. The lattice-matched active layer composition was chosen so that the emission 24 has a wavelength $\lambda = 1.3$ $\mu$m. A p-InP cladding layer 16 about 1.5–1.6 $\mu$m thick was grown followed by a p+-InGaAsP cap layer 17 about 0.3–0.4 $\mu$m thick used for contacting purposes. Rectangular (250 $\mu$m × 125 $\mu$m) AuZn ohmic contacts 28 were defined on the p-side of the wafer by photolithographic processing which involved plasma deposited $Si_3N_4$ masks, plasma etching the masks in $CF_4$ and $O_2$, thermal evaporation of Au and Zn, and lift-off techniques. The long dimension of the contact 28 was aligned along the [0$\bar{1}$1] direction. The substrate side of the wafer was then thinned to 100–125 $\mu$m and a AuSn broad area contact 26 was applied to the bottom of the substrate 12. A $Si_3N_4$ etch-masking layer 1000 Angstroms thick was plasma deposited on the p-side of the wafer over the AuZn contact pads. Subsequent photolithographic steps, including plasma etching, were used to define Si$_3$N$_4$ rectangular masks 30 (300 μm × 150 μm) directly over the AuZn contacts 28. By recessing the AuZn ohmic contact 28 inside the Si$_3$N$_4$ mirror-etching masks (FIG. 1) and by controlling the etching time, we eliminated attack of the ohmic contact by the subsequent mirror-etching procedure.

The mirror-etching procedure used exploits the preferential etching characteristics of InP and InGaAsP. One advantage of our procedure is that the sidewalls 22 of the laser mesa are defined predominantly by the (111)A slow etch planes. Therefore, there is very little, if any, undercutting of the laser sidewalls. This "self-limiting-etch" characteristic eases substantially the requirements on etching control during the mirror-etching procedure. The chemical etch used for mirror definition was 0.2 volume percent Br in methanol solution. This etchant resulted in preferentially etched (111)A laser sidewalls 22 but isotropically etched, extremely smooth mirror surfaces 20. The laser mirrors are defined by etching through the epitaxial layers and into the InP substrate 12. Many isolated, discrete lasers can be batch fabricated on a single substrate in this fashion. The etching depth determined the degree to which vertical, or near-vertical, mirrors were achieved. For example, etching for about 4 minutes produced mesas about 10 μm high and surfaces 20 essentially perpendicular to active layer 18. The excellent properties of the chemical etchant combined to allow ease of fabrication, good mirror properties, and thus low laser thresholds to be obtained.

Broad area lasers (380 μm × 250 μm) were also fabricated from the same wafer using conventional cleaving techniques. A comparison of the properties of the batch-processed etched-mirror lasers with the conventionally fabricated broad area lasers was carried out.

The pulsed light-current characteristics were measured for an InGaAsP etched-mirror laser and for a broad area laser fabricated from the same wafer. The lasers were driven with 100 ns duration pulses at a rate of 100 pulses per second. The etched-mirror laser had a threshold current of 1.5 A corresponding to a threshold current density of 3.3 kA/cm$^2$. The threshold current for the broad area laser was 2.6 A corresponding to a threshold current density of 2.7 kA/cm$^2$. Average threshold current densities of 4.1 kA/cm$^2$ and 3.0 kA/cm$^2$ were measured for the etched-mirror lasers and broad area lasers, respectively. These results indicated that the average threshold current density of the InGaAsP etched-mirror lasers was only ~40 percent higher than comparable conventionally fabricated broad area lasers made from the same wafer. In previous results for discrete etched-mirror AlGaAs heterostructure lasers, Logan et al [JAP, Vol. 47, page 3503 (1976)] indicated that threshold current densities only as low as ~50 percent greater than cleaved-mirror lasers could be obtained.

The reduction in threshold current as a result of reducing laser length was also apparent from the light-current measurements. Etched-mirror lasers 300 μm long had a threshold current of about 1.5 A, whereas cleaved-mirror lasers 380 μm long had a threshold of 2.6 A. Since very short etched-mirror lasers can be easily fabricated, it is possible to exploit this geometrical property so as to realize very low threshold current lasers. By combining the strip-buried-heterostructure laser geometry with short cavity lengths made possible by the etched-mirror lasers described herein, InGaAsP lasers emitting at 1.3 μm with excellent emission properties and very low threshold currents can be fabricated.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, while we used Si$_3$N$_4$ as the mirror-etching mask 30, SiO$_2$ and other dielectrics are also suitable. In addition, while Br-methanol is preferred for etching the laser mirrors, other etchants may be suitable or required. Thus, we used 10H$_2$SO$_4$:1H$_2$O$_2$:1H$_2$O and 60 percent HCl sequentially as stop etches to form etched mirrors on an InP-InGaAsP DH laser in which the InGaAsP active layer was coupled to an underlying InGaAsP waveguide layer. The acidic-peroxide solution was used to etch the quaternary layers and the HCl to etch the binary layers. These etchants etch the mirrors faster than the sidewalls and, whereas the sidewalls etch preferentially along (111) planes, the mirrors do not etch isotropically.

Finally, we also used our inventive techniques to fabricate stripe-geometry (25 μm width) InP-InGaAsP DH lasers, as well as the previously described broad area contact lasers. Narrower stripes (e.g., 8 μm or 12 μm) can also be made.

We claim:

1. A method of fabricating mesa geometry devices from a semiconductor body comprising the steps of
    forming a plurality of metal layers on separate localized portions of a major surface of said body,
    forming an etch-resistant mask over each of said metal layers so that each of said metal layers is recessed within the periphery of its corresponding mask and other portions of said surface are exposed,
    subjecting said body to an etchant effective to attack said other portions of said surface thereby forming said mesas under said masks, and
    controlling the etching time so that said mesas do not undercut said metal layers.

2. The method of claim 1 including, after said subjecting step, the additional step of removing said masks from said metal layers.

3. The method of claim 1 wherein said mesas each have two pairs of opposing sidewalls and said etchant etches one of said pairs at a faster rate than the other of said pairs.

4. The method of claim 3 wherein said etchant etches said one pair isotropically and said other pair preferentially along crystallographic planes.

5. The method of claim 4 wherein said body comprises a Group III–V compound, said major surface is a (100) crystallographic plane and said etchant etches said other pair of sidewalls preferentially along (111) planes.

6. The method of claim 5 including the additional step of forming a portion of said body by epitaxially growing a plurality of layers on a single crystal substrate.

7. The method of claim 6 wherein one of said layers comprises the active region of a semiconductor laser, and said subjecting step is effective to etch said one pair of sidewalls essentially perpendicular to said active layer, thereby forming a cavity resonator along the [011] direction.

8. The method of claim 7 wherein said growing step includes epitaxially growing layers of InP and In- GaAsP, and wherein said active layer comprises InGaAsP.

9. The method of claims 5, 6, 7 or 8 wherein said etchant comprises a solution of Br in methanol.

10. The method of claim 3 wherein said body includes layers of InP and InGaAsP and wherein said subjecting step comprises subjecting said InP layers to an etchant comprising HCl and said InGaAs layers to an etchant comprising $H_2SO_4$ and $H_2O_2$.

11. A method of fabricating a mesa geometry, etched-mirror semiconductor heterostructure junction laser comprising the steps of epitaxially growing a plurality of layers of InP and InGaAsP on a (100) oriented single crystal InP substrate, one of said InGaAsP layers forming the active region of said laser, forming a plurality of rectangular metal contact layers on separate localized portions of a major surface of the topmost of said epitaxial layers, forming a rectangular etch-resistant dielectric mask over each of said metal layers so that each of said metal layers is recessed within the periphery of its corresponding mask and other portions of said surface are exposed, subjecting said exposed surface portions to an etchant effective to form said mesa with two pairs of opposing sidewalls, one of said pairs, which form said mirrors, being etched at a much faster rate than the other of said pairs, and controlling the etching time so that said mesas do not undercut said metal layers, said one pair of sidewalls intersects said active region and are essentially perpendicular thereto, thereby forming a cavity resonator which extends along the [011] direction.

12. The method of claim 11 wherein said subjecting step includes subjecting said exposed surface portions to an etchant which etches said one pair of sidewalls isotropically and said other pair of sidewalls preferentially along crystallographic (111) planes.

13. The method of claim 12 wherein said etchant comprises a solution of Br and methanol.

* * * * *

UNITED STATES PATENT AND TRADEMARK OFFICE
CERTIFICATE OF CORRECTION

PATENT NO. : 4,276,098

DATED : June 30, 1981

INVENTOR(S) : Ronald J. Nelson et al.

It is certified that error appears in the above—identified patent and that said Letters Patent is hereby corrected as shown below:

Column 1, line 42, "the" should read -- that --.

Column 3, line 19, "($0 \leq x \leq 0.4$)" should read -- ($0 \leq x \leq 0.4$) --.

Column 3, line 21, ">X>" should read -- > x > --.

Column 4, line 44, "begin" should read -- began --

Column 4, line 52, "has" should read -- had --.

Column 7, line 8, "InGaAs" should read -- InGaAsP --.

Signed and Sealed this

Twenty-seventh Day of April 1982

[SEAL]

Attest:

GERALD J. MOSSINGHOFF

*Attesting Officer*  *Commissioner of Patents and Trademarks*